United States Patent
Marek

(10) Patent No.: US 7,141,979 B2
(45) Date of Patent: Nov. 28, 2006

(54) CRYO HEAD WITH A PLURALITY OF HEAT EXCHANGERS FOR COOLING THE RF COILS OR RESONATORS

(75) Inventor: Daniel Marek, Moeriken (CH)

(73) Assignee: Bruker Biospin AG, Faellanden (CH)

( * ) Notice: Subject to any disclaimer, the term of this patent is extended or adjusted under 35 U.S.C. 154(b) by 77 days.

(21) Appl. No.: 10/917,395

(22) Filed: Aug. 13, 2004

(65) Prior Publication Data

US 2005/0046423 A1  Mar. 3, 2005

(30) Foreign Application Priority Data

Sep. 2, 2003 (DE) ................................ 103 40 352

(51) Int. Cl.
*G01V 3/00* (2006.01)
(52) U.S. Cl. ..................................... 324/322
(58) Field of Classification Search ............... None
See application file for complete search history.

(56) References Cited

U.S. PATENT DOCUMENTS

| | | | | |
|---|---|---|---|---|
| 5,412,363 A | * | 5/1995 | Breneman et al. | 335/216 |
| 5,508,613 A | | 4/1996 | Kotsubo | |
| 5,513,498 A | | 5/1996 | Ackermann et al. | 62/51.1 |
| 5,889,456 A | * | 3/1999 | Triebe et al. | 335/300 |
| 5,934,078 A | * | 8/1999 | Lawton et al. | 62/3.1 |
| 6,437,570 B1 | | 8/2002 | Marek | |
| 6,441,617 B1 | | 8/2002 | Marek | |
| 6,466,019 B1 | * | 10/2002 | Marek | 324/318 |
| 6,516,282 B1 | * | 2/2003 | Hedlund et al. | 702/132 |
| 6,531,870 B1 | * | 3/2003 | Heid et al. | 324/318 |
| 6,677,751 B1 | * | 1/2004 | Marek et al. | 324/318 |
| 6,679,066 B1 | * | 1/2004 | Funayama et al. | 62/50.2 |
| 2003/0098689 A1 | | 5/2003 | Marek | |

FOREIGN PATENT DOCUMENTS

JP   2000105072   4/2000
WO  WO 03/023 433   3/2003

* cited by examiner

*Primary Examiner*—Diego Gutierrez
*Assistant Examiner*—Dixomara Vargas
(74) *Attorney, Agent, or Firm*—Paul Vincent

(57) ABSTRACT

A cryohead (1) for nuclear magnetic resonance (NMR) measurements, comprising at least one detection channel for receiving NMR signals and at least one transmitting and decoupling channel, wherein different radio frequency (RF) coils or resonators (11, 12, 12b) are provided for the different channels, wherein the cryohead (1) comprises a heat exchanger which can be cooled by a passing fluid, in particular helium, and wherein the RF coils or resonators (11, 12, 12b) of at least one detection channel and also of at least one transmitting or decoupling channel can be cooled to cryogenic temperatures, is characterized in that at least two heat exchangers (14, 15) are provided., wherein at least one first heat exchanger (14) cools the RF coil or the resonator (11) of the at least one detection channel, and at least one further heat exchanger (15) cools the RF coil or the resonator (12, 12b) of the at least one transmitting or decoupling channel, and wherein the at least one first heat exchanger (14) is separated from the at least one further heat exchanger (15). The inventive cryohead minimizes the absolute temperature of the detection coil during operation and eliminates temperature fluctuations in the detection coil.

16 Claims, 11 Drawing Sheets

CRYO HEAD WITH A PLURALITY OF HEAT EXCHANGERS FOR COOLING THE RF COILS OR RESONATORS

This application claims Paris Convention priority of DE 103 40 352.3 filed Sep. 02, 2003 the complete disclosure of which is hereby incorporated by reference.

BACKGROUND OF THE INVENTION

The invention concerns a cryohead for nuclear magnetic resonance (NMR) measurements, comprising at least one detection channel for receiving NMR signals and at least one transmitting or decoupling channel, wherein different radio frequency (RF) coils or resonators are provided for the various channels, the cryohead comprising a heat exchanger which can be cooled by a fluid, in particular helium, flowing therethrough, wherein the RF coils or resonators of at least one detection channel and of at least one transmitting or decoupling channel can be cooled to cryogenic temperatures.

A cryohead of this type is disclosed in U.S. Pat. No. 5,889,456.

BACKGROUND OF THE INVENTION

In a device for NMR measurements, a so-called probe head is located in a strong static magnetic field, usually produced by a superconducting magnet. The sample to be measured is inserted into this probe head. The probe head includes radio frequency (RF) coils or resonators which excite the nuclear spins and detect the signals generated by the excited nuclear spins. Since the nuclear spin signals are generally very weak, the signal-to-noise ratio (S/N) is always a very important, or even the most important performance criterium in nuclear magnetic resonance. This S/N ratio can be improved in a very efficient manner by cooling the receiving coil down to minimum temperatures thereby increasing the efficiency and at the same time minimizing thermal noise. Such probe heads are called cryoheads. The present invention concerns one aspect of cooling the receiving coil with the aim of keeping this temperature as low and stable as possible with simultaneous radio frequency irradiation onto another nucleus to minimize unnecessary deterioration of the S/N ratio and additional measurement artefacts.

Most cryogenic probe heads include a detection channel (e.g. 1H (protons)) and one or more so-called decoupling channels (e.g. 13C and 15N (isotopes of carbon or nitrogen)). They usually also have a locking channel for stabilizing the magnetic field, which uses deuterium (2H). A probe head of this type is called a triple-resonance-inverse head (TXI).

A probe head of this type is explicitly discussed in the embodiment below which is not to be regarded as a limitation, rather an example of the inventive teaching. All other combinations of detection and decoupling nuclei are possible. In particular, it is also possible to examine the same nucleus with two channels and therefore with two RF coils at the same frequency, one channel for transmitting and the other for receiving.

For a TXI head, it is important to maximize the sensitivity of the detection channel (1H). During normal operation, the decoupling nuclei (13C and 15N) are used only for decoupling and magnetization transfer. Such a probe head typically comprises two RF coils. An inner coil at which the detection channel is disposed, and a second outer surrounding coil at which the X channels (13C and 15N) are disposed. The locking nucleus may be circuited along with either the inner or the outer coil.

In conventional probe heads, the sensitivity (i.e. the signal) is optimized by disposing the detecting coil as closely as possible to the sample, i.e. at the very inside around the sample. The cryoheads are additionally optimized by cooling the RF coils to low temperatures, typically <25K. Typically, the pre-amplifier is also cooled to prevent its noise contribution from becoming overproportionally large compared to the very low thermal noise of the receiving coil. It may be operated at temperatures of e.g. 77K or less.

In a cryohead, heat is typically removed from the coil system via a cold gaseous He cycle. A preferred embodiment uses a Gifford-McMahon Cryocooler to cool the cold He cycle. Such coolers usually have two stages to obtain the required low temperatures.

The pre-amplifier-in,-accordance with prior art is also advantageously cooled to prevent unnecessary increase in noise. The pre-amplifier is also conventionally and advantageously installed in the cryohead to minimize S/N losses through the signal lines between the RF coil and the pre-amplifier. The pre-amplifier is also conventionally cooled by the cryocooler.

U.S. Pat. No. 5,889,456 (FIG. 3a of U.S. Pat. No. 5,889,456) describes a particularly favorable embodiment which provides a large degree of flexibility and is schematically shown herein in FIG. 2. The cooling power of a two-stage Gifford-McMahon Cooler (coldheads) 6 is thereby tapped at both stages 7 and 8 and the cryohead 1 has two cold sinks (heat exchangers) 38 and 39 at different temperatures. The cold is typically transported from the cooling system 5 to the cryohead 1 via gaseous helium which circulates through the two cooling loops 9 and 10. The warmer temperature [approx. 77K] is conventionally used to cool the pre-amplifiers and structural elements in the cryohead using the warmer cycle 9, which helps to reduce the required cooling power for the cold cycle. This is, in particular, possible since the cooling power at the warmer stage 7 of the coldhead 6 is substantially larger than at the colder stage 8. The cold cycle 10 [<25K] is then used to cool the RF coil arrangement with minimum loss in thermal efficiency and temperature.

The sample 2 to be measured is located in a so-called central tube 22 which is permeable for the radio frequency fields and which extends through the cryohead. This tube and the sample 2 are approximately at room temperature. The detection coil 11 and the decoupling coil 12 are cooled to working temperature (<25K) via the heat exchanger 13. A vacuum 3 is established inside the cryohead which ensures the required thermal insulation of the cold parts from the central tube and therefore of the sample and to the outer surfaces of the cryohead.

The pre-amplifier 4 is also cooled. The coil heat exchanger 13 is cooled by the cooling loop 10 ("cold cooling loop") and the pre-amplifier is typically cooled to 77K using the cooling loop 9 ("warm cooling loop").

The cold is generated in the cooling system 5 in the coldhead 6 and is connected to the cryohead through the likewise evacuated transfer line 40. The coldhead 6 typically comprises two stages, the first stage 7 having a temperature of approximately 40–77K and the second stage 8 having a temperature of <25K. The cooling medium, He gas in the present case, is driven by a compressor (not shown) which is operated at room temperature and is connected to the cooling system via connections 41. The He gas is initially at room temperature and is pre-cooled by the counterflow heat exchanger 32 and then further cooled by the staged heat exchanger 38 of the first coldhead stage 7. It then passes through the second counterflow heat exchanger 33 where it is further pre-cooled, and to the staged heat exchanger 39 of the second coldhead stage 8.

The minimum temperature is thereby reached. The He then passes into the cryohead where the heat exchanger 13 is cooled as described above. After the He has returned to the cooling system, it passes via the counterflow heat exchanger 33 and then through the cooling loop 9 to the head where it cools the electronics. Upon returning to the cooling system 5, it cools the incoming gas at the counterflow heat exchanger 32 and leaves the cooler at connection 41, returned to room temperature, for further transport in the compressor.

The throttle valve 34 forms a bypass for optional regulation of the cooling power of the cooling loop 9.

U.S. Pat. No. 5,889,456 provides an exact thermal analysis of such a system. A system of this type provides excellent function, saves cooling power and is also very robust and undemanding in terms of required thermal design.

It is also possible to cool the RF coils and the pre-amplifier(s) with only one cycle. The cooling details of the pre-amplifier electronics have no primary relevance to the present invention and are not explained in more detail herein.

The disadvantages of prior art systems are as follows:

There is an inherent contradiction between the functions of the two coils: First of all, the detection coil 11 should always operate at minimum temperatures to keep the thermal noise at a minimum. However, the decoupling coil 12 generates large RF fields and is therefore exposed to high RF powers. These are largely dissipated in the coil itself which is therefore exposed to high thermal power. In case of decoupling, powers on the order of magnitude of 10W are dissipated over long time periods. These powers form the main thermal load of the cryohead while the detection coil (except for the comparatively very low radiation losses towards the sample) requires nearly no or only comparably little cooling power. The decoupling powers $P_D(t)$ are typically applied in pulses (FIG. 3). (The individual power pulses 50 may consist either of a continuous power (CW) or have a further internal structure, i.e. consist of a series of successive pulses (e.g. CPD=Composite Pulse Decoupling). This is, however, not important in the present case. It is only important that a high power is dissipated during the time interval 50). A simple example, which is by no means exhaustive, will be used to illustrate these embodiments. In accordance therewith, decoupling takes place at a duration of 200 msec during the time intervals 50, i.e. an RF power is applied to the decoupling coil and a pause 51 of 0.8 sec passes until the spin system has relaxed again. This produces a repetition period 52 of 1 sec and a duty cycle D of 0.2 or 20%. Many other pulse sequences are also used. The duty cycle may, in particular, be considerably higher.

The detection coil should operate at as constant a temperature as possible during the entire experiment to prevent noise changes or increases during operation. It is also possible that the inherent resonance of the coil depends to a certain degree on the temperature which could cause frequency changes in the coil during pulsed operation of decoupling which could produce disturbing phase modulation artefacts in the resulting spectra.

The detection coil 11 is conventionally thermally cooled by the same heat exchanger 13 as the decoupling coil 12. To prevent variations of the coil temperature, the temperature of the heat exchanger 13 is conventionally kept constant through active regulation, which consists of a temperature sensor 36 and a heater 37, via a regulation system (not shown) (FIG. 4).

This function is satisfactory at first glance but entails a series of disadvantages upon exact analysis, which result from the following facts:

1. inefficiency of the heat exchanger 13
2. limited thermal transport capacity of He gas
3. the temperature control is only static (average value) and can generally perform no dynamic control.
4. dynamic control would make sense only to a limited degree, since it would require regulation to the maximum, very high temperature.
5. it is very difficult to measure the actual temperature of the RF coil itself and its control would consequently also be difficult, in particular in the presence of large temporal variations.

The above-mentioned points will be discussed below.

Although the control may indicate a constant temperature, the actual temperature dependence of the RF coils is not that simple, as is shown in FIG. 5 for a conventional arrangement.

The time dependence of the decoupling power $P_D(t)$ is shown in the upper representation of FIG. 5. The lower part shows the temperature increase of both RF coils $\Delta T_c$ (compared to a case without decoupling).

In any event, the average power $\{P_D\}$ results in an increase in the average temperature which is indicated by $T_{AVE}$.

This produces a certain average temperature $T_{AVE}$. If the control point of the regulator is set at this or a higher temperature, the probe head can be kept constant at this temperature with or without decoupling.

This, however, is not the entire situation. If the temperature dependence is observed in a time-resolved dynamic manner, one obtains the result shown with the broken lines $T_{Dyn}$.

It must thereby be noted that due to the very fast heating, the control system cannot readjust during this time. If this were possible, only the variation of the temperature would be eliminated. Towards this end, the set point would have to be moved to an extremely high asymptotic temperature $T_{ASy}$ which would not lead to an improvement in the absolute (maximum) temperature (see below).

During the pulse, the coil components and the heat exchanger 13 are rapidly heated, since a very high power is applied during this time which greatly exceeds the average (CW) power (factor 1/D).

Use of the pulse power on the decoupling channel therefore initially produces a considerable temperature increase (FIG. 5 bottom) whose steepness is given by the specific heat of the heat exchanger and the coil arrangement. For a high specific heat C of the coil component and the heat exchanger 13, the heating is moderate before the cooling phase starts again, as is indicated by $T_{Dyn}(1)$.

If C is small, the temperature rises quickly as is indicated by $T_{Dyn}(2)$. The temperature reaches the maximum asymptotic temperature $T_{ASy}$ already within the decoupling period and more or less stabilizes. This value is much higher than the average temperature $T_{Ave}$ (due to the factor 1/D).

It is thereby disadvantageous that precisely during this time 50, the acquisition (data acquisition) takes place at the receiving channel, i.e. exactly when the noise of the detection coil and therefore also its temperature should be minimum.

The specific heat of the conventional heat exchanger materials (metals) considerably decreases with decreasing temperatures in the temperature range of interest. For systems which operate at low temperatures, this specific heat C thereby decreases more and more thereby approaching the extremely high $T_{ASy}$ within the decoupling pulse.

The considerably higher temperature during acquisition can greatly exceed the average and instantaneous temperature. Moreover, the temperature of the receiving coil changes greatly during operation which can produce tuning errors and, phase changes during acquisition and may lead to serious spectral phase errors which cannot be corrected.

The conventional thermal behavior of the detection coil is therefore actually much worse than the steady average control temperature of the regulation system, and is therefore certainly less than ideal. The actual temperature of the detection coil can, in particular, be substantially higher than the theoretical temperature thereby reducing the actual performance and spectral quality.

It is the object of the present invention to eliminate the above-mentioned disadvantages of prior art, in particular, to ensure a minimum and constant absolute temperature at the receiving coil.

SUMMARY OF THE INVENTION

This object is achieved by a cryohead of the above-mentioned type in that at least two heat exchangers are provided, wherein at least one first heat exchanger cools the RF coil or the resonator of the at least one detection channel and at least one further heat exchanger cools the RF coil or the resonator of the at least one transmitting or decoupling channel, and wherein the at least one first heat exchanger is decoupled from the at least one further heat exchanger.

The above-mentioned subtle but serious disadvantages can be eliminated in accordance with the invention by more or less completely decoupling the cooling of the detection and decoupling coils. Cooling is decoupled in accordance with the invention using at least two spatially separated heat exchangers, namely the at least one first heat exchanger and the at least one further (second) heat exchanger. The overall available cooling power is precisely distributed to the RF coils or resonators of the individual channels. In accordance with the invention, a temperature which is easier to keep constant can be set at the RF coil(s) or resonators of the at least one detection channel, that temperature being lower than that of the RF coil(s) or resonators of the at least one transmitting or decoupling channel, where a high pulsed RF power is applied. Temperature variations in the region of the transmitting or decoupling coils do not influence the temperature of the receiving coil. This considerably improves the quality of the detected NMR signals.

Instead of the conventional single heat exchanger, the inventive probe head has two or more separate heat exchangers which are preferably thermally decoupled. One heat exchanger cools the detection coil and a separate heat exchanger cools the decoupling coil. In the concrete embodiment, various embodiment variants are possible, such as those listed below.

In one preferred embodiment of the inventive cryohead, the heat exchanger(s) of the at least one detection channel can be cooled by a fluid cooling loop which is separate from the cooling loop of the one or more heat exchanger(s) of the at least one transmitting or decoupling channel. The first and further heat exchangers are then completely decoupled with respect to the fluid and can be operated with respectively adjusted cooling power.

Separate cooling loops are characterized in that they each have their own supply and discharge lines for the fluid (cooling agent) at the probe head (cryohead) which permits setting of separate absolute temperatures in each of the individual cooling loops via the respectively supplied fluid. Separate completely independent cooling agent cycles may also be provided outside of the probe head, in particular, for both cooling loops. Even two separate coolers (coldheads) for the two cycles may thereby be used. In most cases, one single coldhead is used to cool both cycles. Moreover, only one cooling agent cycle may preferably be provided in the entire arrangement, wherein cooling of the cooling agent is effected outside of the probe head with several heat exchangers or cooling stages (cooler) at different locations of the cooling cycle such that different absolute temperatures can be adjusted in the individual sections of the cooling cycle. The individual cooling loops of the probe head are then each integrated in such individual sections of the cooling cycle.

In an alternative, also preferred embodiment, the heat exchanger(s) of the at least one detection channel and the heat exchanger(s) of the at least one transmitting or decoupling channel can be cooled by a common fluid cooling loop. This facilitates construction of the cooling system. The fluid preferably initially passes the heat exchanger(s) of the at least one detection channel to ensure effective and constant (since it comes directly from the cooler) cooling power. The fluid then flows through the heat exchanger or the further heat exchangers of the transmitting/decoupling channels.

In one optimum and simple embodiment of the inventive cryohead for all operating types, the transmitting or decoupling coils or resonators for all channels are disposed on exactly one heat exchanger, namely the further heat exchanger, and the detection coils or resonators for all channels are also located on exactly one heat exchanger, namely the first heat exchanger.

The at least one transmitting or decoupling channel may be designed in accordance with the invention for the same or a different nucleus than the at least one cooled detection channel. The transmitting/decoupling channel may e.g. be designed for 13C and the detection channel for 1H. In another example of an inventive system, separate coils/resonators are provided for transmitting and receiving signals from the same nucleus. The latter systems are particularly advantageous for medical applications.

A resonator may be suitable in accordance with the invention for transmitting or receiving quadrature signals, in particular as a quadrature birdcage resonator. The two RF signals are then guided via separate RF cables.

Other preferred embodiments may be extracted from the dependent claims.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail below with reference to embodiments.

DESCRIPTION OF THE PREFERRED EMBODIMENT

Several preferred embodiments of the invention,are described in detail below.

Within the scope of the invention, embodiments with an RF coil can also be used for a resonator and vice versa. The embodiments of decoupling coils or resonators can also be applied for transmitting coils or resonators and vice versa.

First Embodiment Variant: Complete Decoupling

Figure 6:
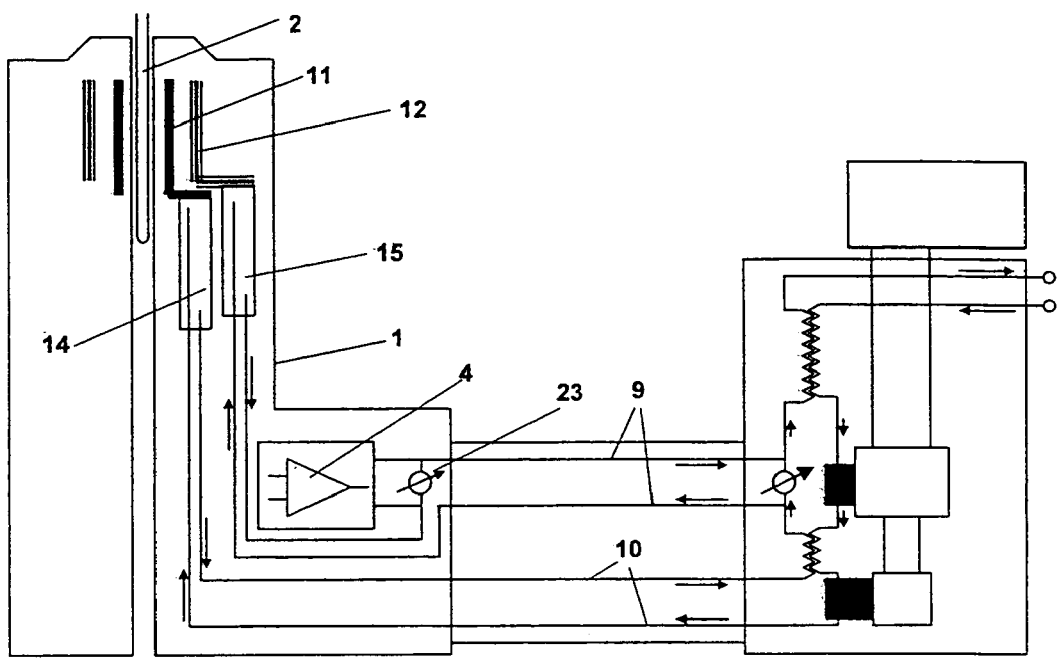
FIG. 6 shows a first variant of the inventive arrangement with cooling of the decoupling coil via a separate heat exchanger.

Such an arrangement is shown in FIG. 6. For reasons of simplicity, a coldhead is used for cooling both cycles in this embodiment variant. The decoupling coil 12 is cooled by the "warm" cycle 9 while the detection coil 11 is cooled by the "cold" cycle 10. In this case, the detection coil 11 would have a temperature of <25K and the decoupling coils a temperature of approximately 40–77K depending on the exact conditions of the coldhead used, and on the structure of the hardware. The distribution of the cooling power between the heat exchanger 15 and the preamplifier electronics may be adjusted by a bypass throttle valve 23, if required.

Figure 7:
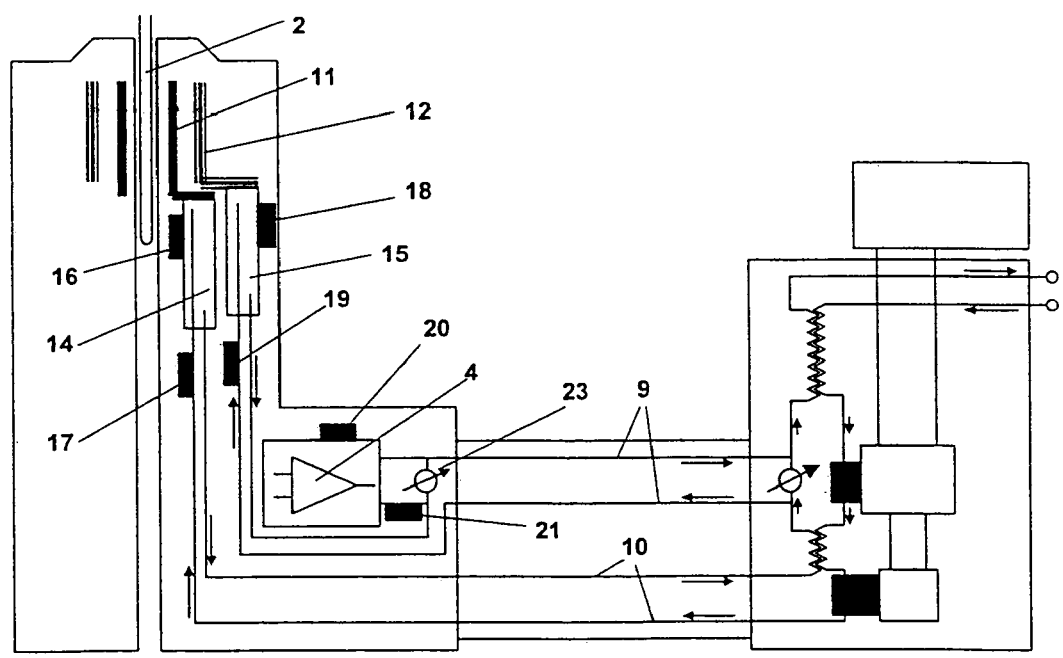
FIG. 7 shows a first variant of the inventive arrangement with temperature measurement and heating elements for temperature control.

FIG. 6 shows no temperature measurement and control (which is not necessarily required in this case) and FIG. 7 shows a full-control arrangement with up to 3 controlled temperatures. (Detection coil 11; temperature sensor 16; heater 17; decoupling coil 12; temperature sensor 18, heater 19; pre-amplifier electronics; temperature sensor 20, heater 21). In addition to control of the pre-amplifier electronics through 20 and 21 which will not be discussed in detail herein, the decoupling coil can also be controlled to an exact average temperature by means of the temperature sensor 18 and the heater 19 which may be of advantage to the long-term stability of the system.

The arrangement of FIG. 6 or FIG. 7 has the substantial advantage that the thermal load of the decoupling coil 12 has only a very indirect effect on the cold cycle 10 and therefore on the detection coil 11 which can practically be neglected. Moreover, the two characteristic performances (temperature versus thermal load) of the two cryocooler stages 7 and 8 are typically largely decoupled. The cooling power of the second stage is, in particular, often nearly independent of the load on the first stage. The first stage of the coldhead has a much larger cooling power than the second stage (typically over 20W in the first stage 7 compared to 1–5W in the second stage 8). This permits decoupling powers which are extremely high compared to prior art.

The second advantage is that the detection coil and its cooling system can be operated without unnecessary thermal load thereby obtaining the minimum possible temperatures for the detection coil.

The third advantage is that the temperature of the detection coil is highly constant in time, since the pulsed power peaks are nearly completely filtered out by the separate cooling loop 9 and the large mass and therefore high specific heat of the coldhead 6 with its stages 7 and 8 and its heat exchangers 38, 32, 8, 33.

Such an arrangement provides ideal conditions for the detection coil 11: Minimum possible temperature, absolute temperature stability. At the same time, the decoupling coil 12 has a very high cooling power.

This arrangement offers great advantages. However, in particular, when using the same coldhead for both cycles, it also has certain disadvantages which may have a negative effect, depending on the application.

a) the decoupling coil 12 is operated at a higher temperature compared to prior art. This is disadvantageous in that its RF resistance is generally not as low as it would be at a lower temperature, therefore requiring more power for the same coil current (the same RF field strength). Moreover, in some applications, the decoupling coil is a receiver. Such a coil which is operated at a very high temperature does not have an optimum S/N in this case. Moreover, RF losses at the detection frequency which result from the presence of the decoupling coil and the unavoidable radio frequency couplings of the detection and decoupling coils, are slightly higher than if the decoupling coil were as cold as the detection coil (increased RF resistance and therefore higher losses; the noise for a given Q value loss of the detection coil would be increased due to the higher physical temperature).

2. Embodiment Variant: Series Cooling

In cases, wherein the disadvantages of the first embodiment variant are considered to be too serious for use or for systems without a second cooling cycle, a simplified embodiment may be used which does not seem to be very reasonable or innovative at first glance but which actually has great advantages when precisely analyzed.

Figure 1:
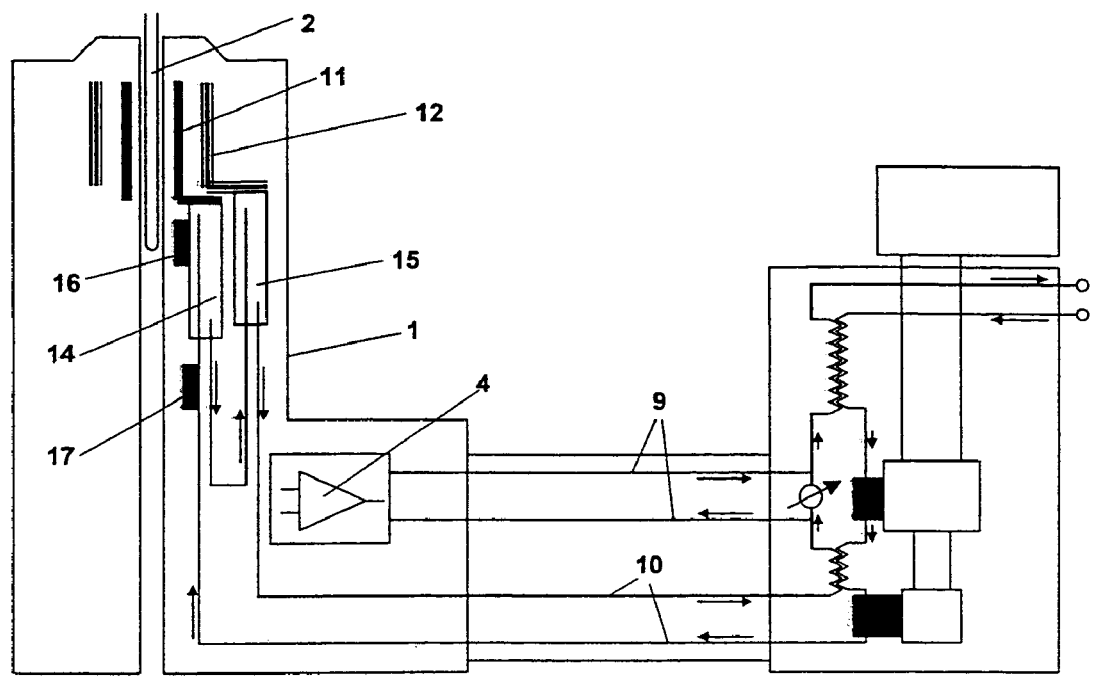
FIG. 1 shows a second variant of the inventive arrangement, wherein the heat exchangers are connected in series, with temperature measurement and heating element for controlling the temperature of the first heat exchanger.

FIG. 1 shows such an arrangement. The heat exchanger 15 of the decoupling loop 12 is not cooled by the "warm" cycle 9 as in the first embodiment but directly also by the "cold" cycle 10 like the heat exchanger 14 of the detection coil 11. It is thereby essential that the two heat exchangers are not directly thermally coupled but connected in series, wherein the detection heat exchanger 14 is preferably supplied first with cold He.

Figure 8:
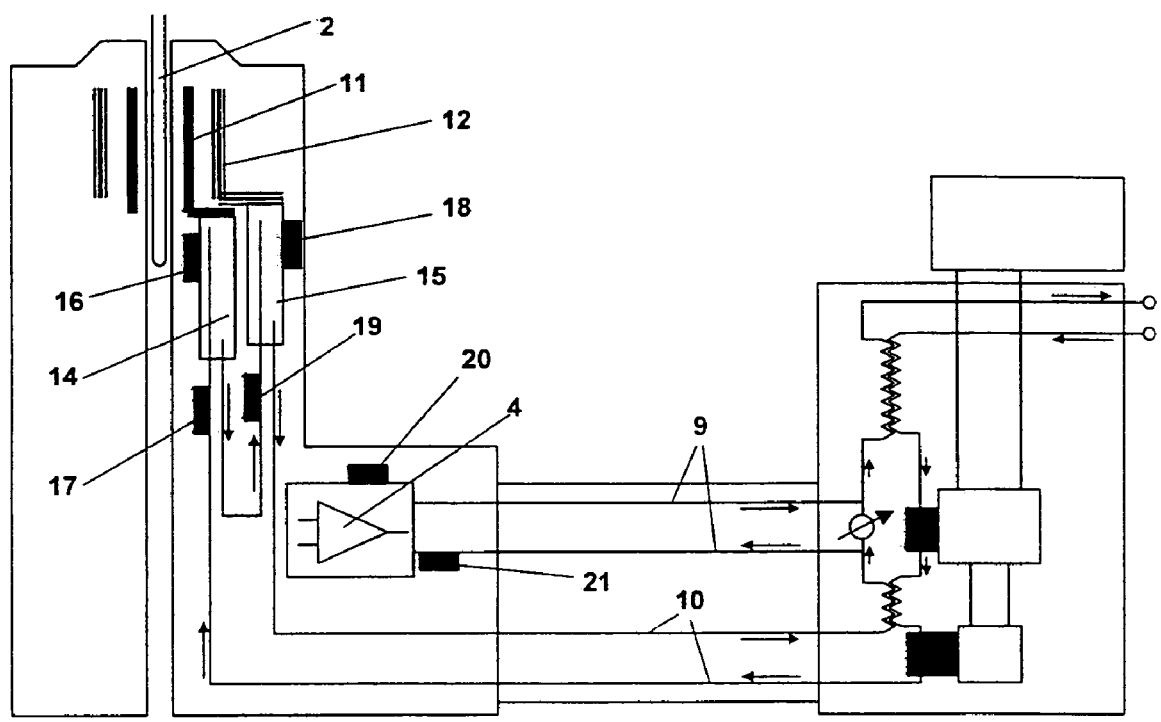
FIG. 8 shows a second variant of the inventive arrangement, wherein the heat exchangers are connected in series, with temperature measurement and heating elements for controlling the temperature of all heat exchangers.

The function of such an arrangement is described below.

a) the cold He from the cooler stage 2 (8) passes directly into the heat exchanger 14 in the cryohead. The heat exchanger is optionally controlled at a constant temperature by means of a heater 17 and temperature sensor 16. The heater 17 may be disposed upstream of the heat exchanger 14 or on the heat exchanger 14.

b) after the He cooling agent has passed through the first heat exchanger 14, it enters the second heat exchanger 15 cooling same. It may have a free (unregulated) temperature (shown in FIG. 1) or also be controlled at a constant average temperature by means of a heater 19 and temperature sensor 18 (FIG. 8). This desired control temperature T2 of the decoupling heat exchanger 15 would in any case be slightly higher than the temperature T1 of the detection heat exchanger 14. In addition to control of the pre-amplifier electronics through 20 and 21 which will not be discussed in detail, the decoupling coil can also be controlled to an exact average temperature via a temperature sensor 18 and the heater 19. This could be advantageous for the long-term stability of the system.

Figure 4:
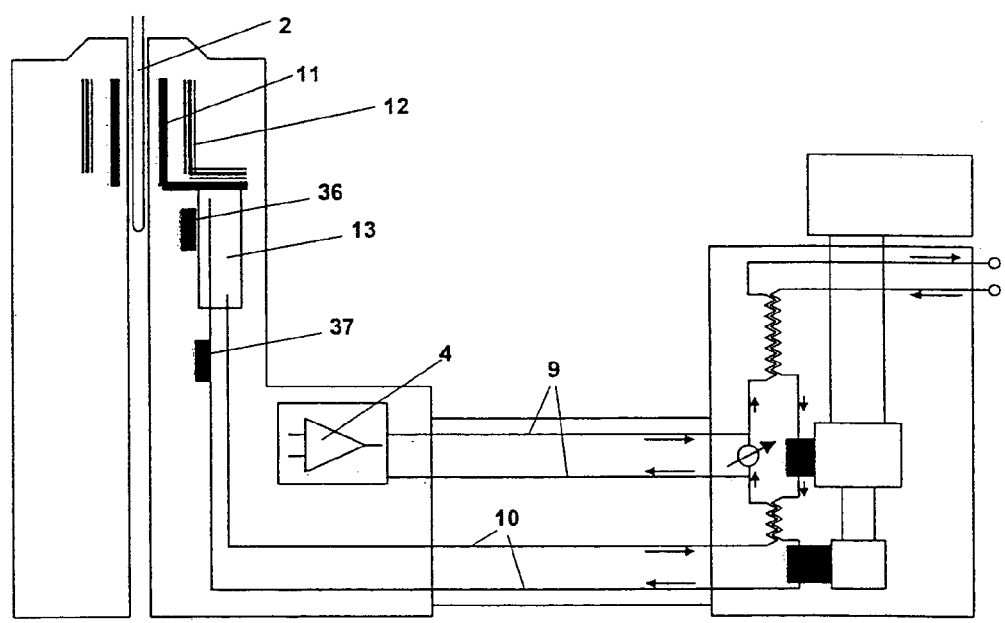
FIG. 4 shows a system in accordance with prior art with a regulated heat exchanger for both RF coils.
Figure 5:
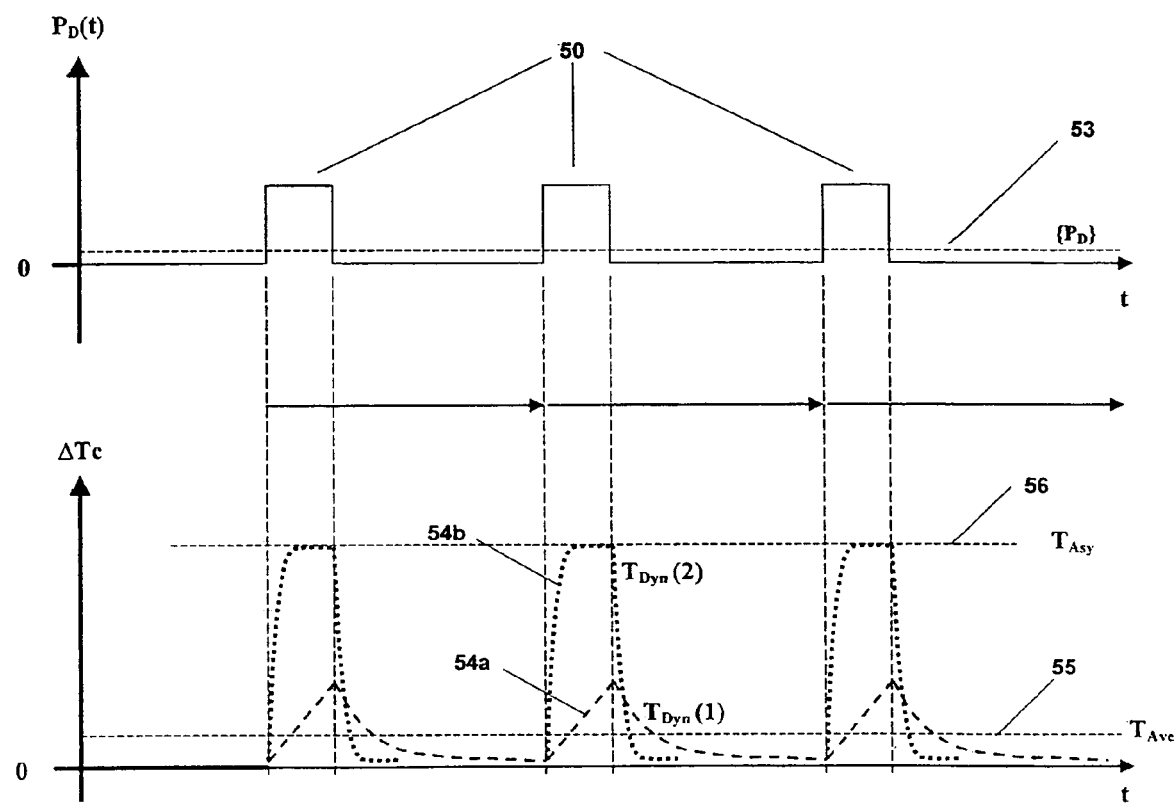
FIG. 5 shows a power-time diagram and temperature difference-time diagram for pulsed decoupling in the system of FIG. 4 in accordance with prior art—the common temperature of the RF coils is shown as a function of time in qualitative illustration.

Analysis:

The thermal behavior of the inventive arrangement in accordance with FIG. 1 is compared below with the thermal behavior of a system in accordance with prior art (FIG. 4).

The system of FIG. 1 is herein analyzed and discussed for reasons of simplicity. (The controlled version for the heat exchanger 15 of FIG. 7 is not explicitly discussed herein but has the sole difference that the average temperature of the decoupling coil 12 also remains constant. The minimum possible temperatures during decoupling and the dynamic temperature variations remain practically the same.)

Discussion begins with an analysis of the system in accordance with prior art, followed by an analysis of the inventive arrangement.

1. Analysis of the Arrangement in Accordance with Prior Art

Figure 2:
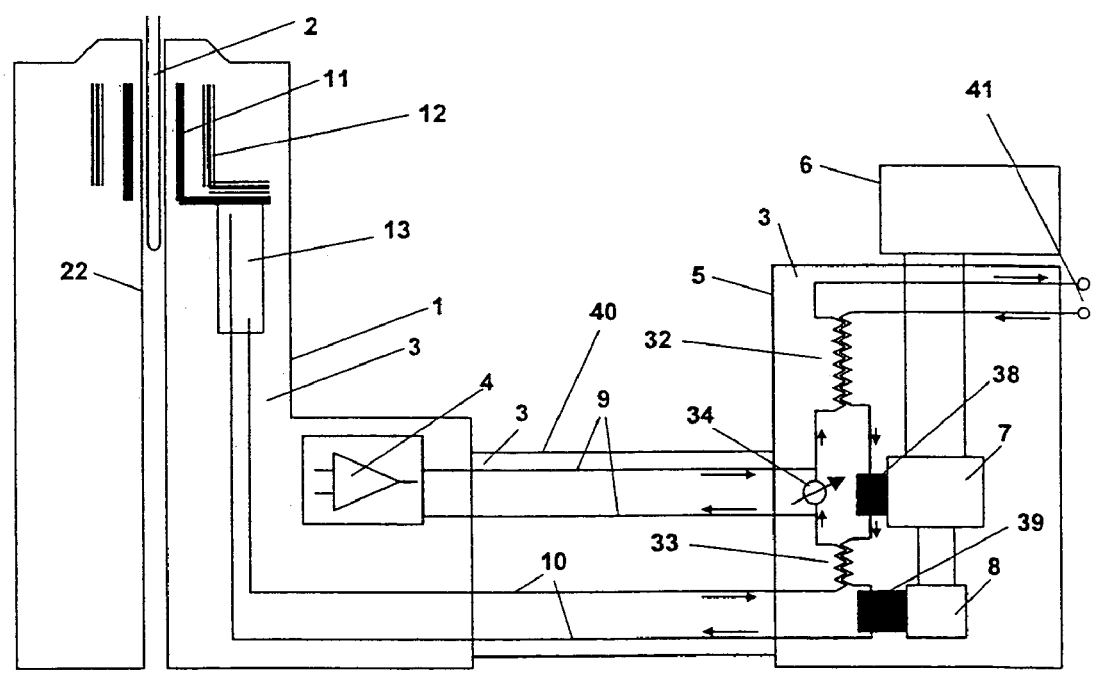
FIG. 2 shows a conventional cryohead with cooling system (overview) with a common heat exchanger for both RF coils.
Figure 3:
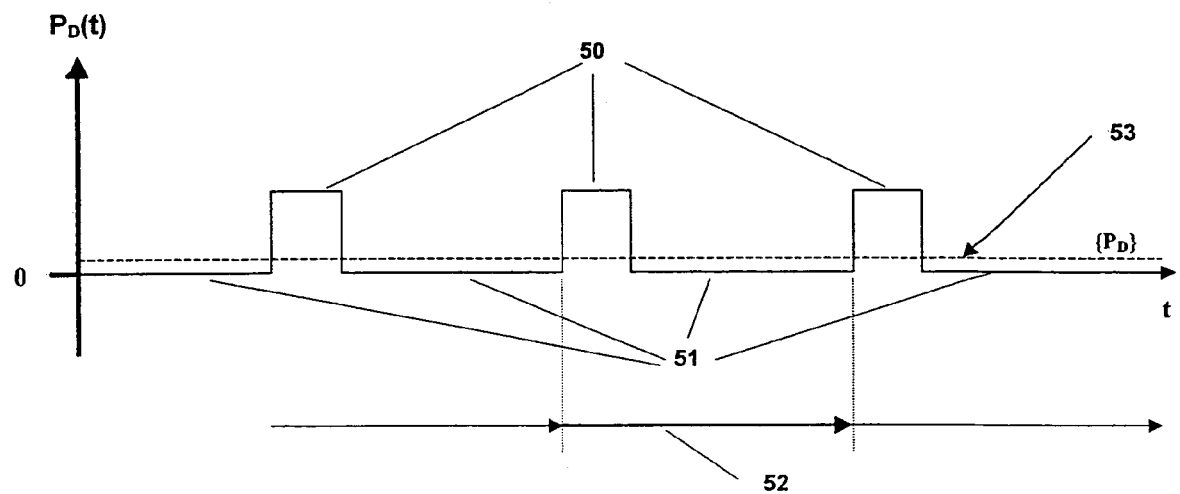
FIG. 3 shows a power-time diagram for pulsed decoupling in accordance with prior art.
Figure 10:
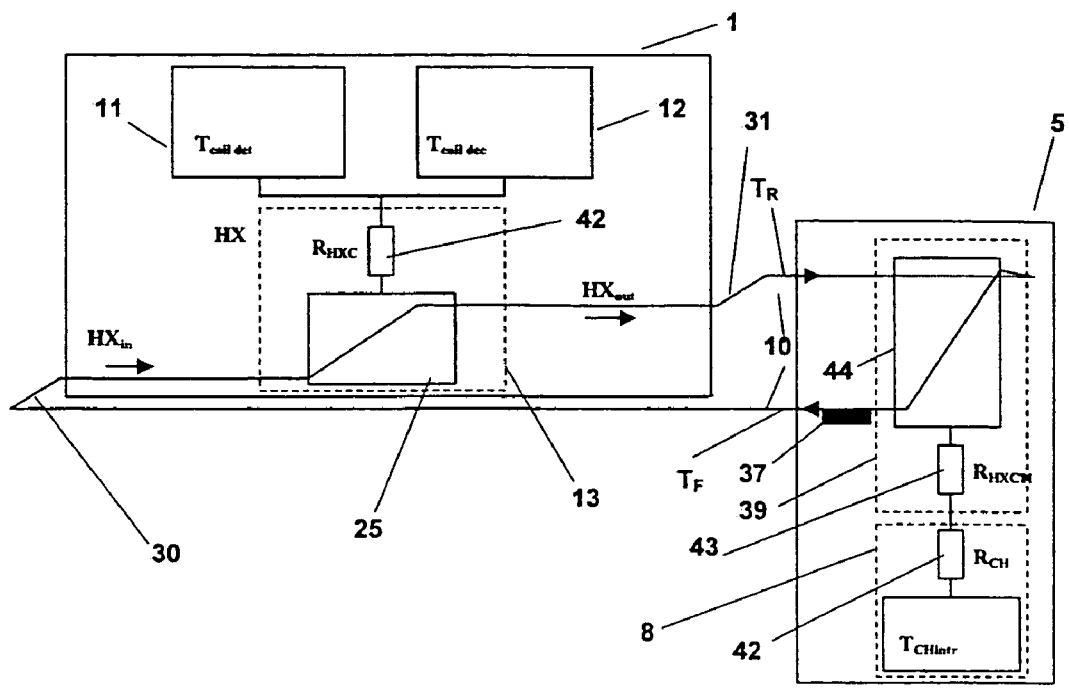
FIG. 10 shows an equivalent thermal circuit-diagram-of an arrangement in accordance with prior art.

An equivalent circuit diagram is required to improve understanding. FIG. 10 shows the equivalent circuit diagram of a conventional arrangement in accordance with FIG. 2.

Only the cycle 10 which cools the RF coils is shown. It is cooled in the cooling system and emits the cold in the cryosample thereby cooling the RF coils. Only the heat exchanger 39 of the second stage 8 of the coldhead 6 of the cooling system is shown. For reasons of simplicity, one assumes that the He gas flows in a circle. (In reality it is guided via the counterflow heat exchanger 33 to the circulation compressor, located at room temperature, and back. This is not important for the present observations and we can assume that He directly re-enters the staged heat exchanger 39 when it reenters the cooling system 5 instead of reaching the counterflow heat exchanger 33. This is admissible since the counterflow heat exchangers only produce thermal insulation of the compressor from the cold stages and the helium which exits the counterflow heat exchanger 33 has nearly the same temperature as the entering helium.)

To better explain the illustration, those parts with higher temperature are more upwardly displaced in FIG. 10. This applies to the individual parts as well as to the gas flow.

The He is cooled down with the heat exchanger 39. The initial temperature $T_F$ of the gas flow exiting the cooling system 5 now depends on the total dissipated power in the cooling cycle. The coldhead has a certain characteristic performance which describes its temperature rise with increasing thermal load. To illustrate this characteristic performance in as simple a manner as possible, one assumes that the coldhead itself is at a given (intrinsic) temperature $T_{CHintr}$. This would be the temperature of the second stage 8 of the cold head without dissipation of RF power in the head.

$$T_F = T_{CHintr} + \{P\}*(R_{CH} + R_{HXCH}) \quad \text{eq. 1a}$$

Wherein $\{P\}$ is the average overall temporally averaged thermal load from the cryohead (larger or equal to the period 52 of the experiment over time periods).

$R_{CH}$ is the equivalent thermal resistance of the coldhead (in its second stage 8 herein), which leads to an increase in temperature as a function of the dissipated power and therefore describes it characteristic performance. The thermal load $R_{HXCH}$ is the internal thermal resistance of the heat exchanger and describes its inefficiency. In the following observations, we can neglect $R_{HXCH}$ since the cooler has enough space for a large heat exchanger with nearly 100% efficiency (or $R_{HXCH}$ can be added to $R_{CH}$) thereby giving:

$$T_F = T_{CHintr} + \{P\}*R_{CH} \quad \text{eq. 1b}$$

This linearization of the coldhead characteristic performance is absolutely sufficient for our purposes.

The He now passes through the feed line 10 to the cryohead. It is thereby slightly warmed in the transfer line (indicated by 30). This effect is small and constant and will also be neglected herein.

The He gas now enters the probe head and flows into the heat exchanger HX (13) thereby cooling both RF coils, i.e. the detection coil 11 and the decoupling coil 12 to working temperature.

On the way back to the cooler, the gas is further slightly heated 31 which is also neglected herein.

The cycle is now complete. The He which has been heated on the path, starting from temperature $T_F$ through assimilation of heat from the cryohead, now has the temperature $T_R$ and comes back into the heat exchanger 39 of the coldhead where it is again cooled and the cycle starts from the beginning.

The behavior of the HE gas in the heat exchangers is important for further analysis and is briefly explained below.

Figure 11:
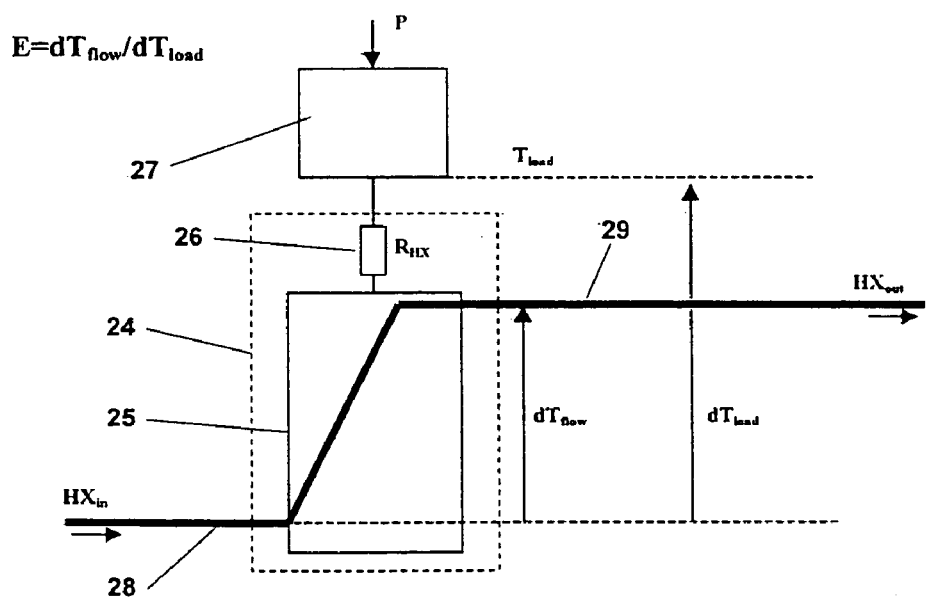
FIG. 11 shows the basic analysis of the equivalent circuit diagram and efficiency of one single heat exchanger.

FIG. 11 schematically shows one single heat exchanger.

The entire heat exchanger 24 is shown in broken lines. Its inside is subdivided into an imaginary 100% efficient heat exchanger 25, which is in series with a thermal resistance 26 $R_{HX}$ which describes the inefficiency of the heat exchanger (see equation 4 and equation 10 below). The gas having a temperature $HX_{in}$ flows in from the left (28). The heat exchanger 24 is thermally connected to the object 27 to be cooled which gives off the thermal load P. The object to be cooled 27 is cooled down to the temperature $T_{load}$.

The thermal load P on the other hand heats the gas flow which leaves the heat exchanger at a temperature $HX_{out}$, wherein $$HX_{out} = HX_{in} + dT_{flow} \quad \text{eq. 2}$$

In accordance with this systemization, the gas flow has been heated up by the temperature $dT_{flow}$ We define $$dT_{load} = T_{load} - HX_{in} \quad \text{eq. 3}$$

as the temperature difference between the temperature $T_{load}$ of the load and the temperature $HX_{in}$ of the entering gas flow.

With a heat exchanger of 100% efficiency, the object would be cooled down to an outlet temperature of $HX_{out}$. In this case, $dT_{load} = dT_{flow}$. With an efficiency of less than 100%, $dT_{load} > dT_{flow}$.

The efficiency E of the heat exchanger is generally defined as $$E = dT_{flow} / dT_{load} \quad \text{eq. 4}$$

It is now important to know the value of $dT_{flow}$ for a given load.

This may be expressed as the continuous heating of the gas packets which flow through the heat exchanger. The following relation to power P is obtained:

$$P = (dm/dt) * Cp * dT_{flow} \quad \text{eq. 5}$$

wherein dm/dt is the mass flow of the gas per unit time and Cp is the specific heat.

This enthalpy balance is the basis for the cooling power of the heat exchanger.

The relation of eq. 5 can be expressed through introduction of a new variable $R_{He}$ as follows:

$$dT_{flow} = R_{He} * P \quad \text{eq. 6}$$

$R_{He}$ is thereby defined as follows:

$$R_{He} = 1/(Cp * dm/dt) \quad \text{eq. 7}$$

On the other hand the temperature drop over $R_{HX}$ is given by $$(dT_{load} - dT_{flow}) = R_{HX} * P \quad \text{eq. 8}$$

The combination of equations 6 and 8 thereby leads to the following expression which is very practical for the following quantitative analysis.

$$dT_{load} = P * (R_{He} + R_{HX}) \quad \text{eq. 9}$$

$R_{He}$ is thereby given by the mass flow of eq. 7. $R_{HX}$ can be expressed as a function of the efficiency E of the heat exchanger using equations 4, 6 and 8 as follows:

$$R_{HX} = R_{He}(1/E - 1) \quad \text{eq. 10}$$

Equation 8 permits the relevant temperature differences to be expressed in practical quantities which are easy to determine.

For the quantitative analysis, we use typical values for the present variables:

For the cooler characteristic performance, we assume a typical value at the working temperature of the second stage of $$R_{CH} = 0.6 K/W \quad \text{eq. 11}$$

With a mass flow in the loop 10 of approximately 100 standard liters He (100 nl) per minute and the known specific heat Cp of $$Cp_{He} = 5200 J/(K * kg) \quad \text{eq. 12}$$

of gaseous helium, an equivalent thermal resistance of helium $R_{He}$ of approximately $$R_{He} = 0.6 K/W \quad \text{eq. 13}$$

is obtained from equation 7.

(The exact correspondence of the values to equation 11 is not required but merely exemplifies the following calculations. It is also reasonable that $R_{He}$ is not larger than $R_{CH}$ to keep the unnecessary thermal transfer losses small). This equivalent resistance $R_{He}$ only states the amount by which the gaseous He must be heated in a heat exchanger to discharge a certain power (eq. 6). It is desirable to keep $R_{He}$ as low as possible. The value of $R_{He}$ can only be reduced by increasing the mass flow. Increase of the mass flow is technically difficult and soon meets practical limits, since the increasing frictional and pressure losses rapidly reduce the efficiency of the cooling loop 10 when the mass flow is excessive. In practice, $R_{He}$ therefore has lower limits and the transfer losses cannot be reduced below a certain value.

In the following analysis, it is important to realize that there are basically two power regions:

1. There is an average power referred to with {P} which is substantially generated by the decoupling coil 12 and must be discharged and subsequently deposited in the coldhead via the heat exchanger 13 and the helium, from which it must be discharged. The challenge thereby is mainly to see that this average power results in as low a heating of the detection coil as possible.

2. The second problem results from the fact that the power is not continuous but in pulses, wherein the power during the pulse is very high (for decoupling pulses typically 5 times higher than the average power). The difficulty is that signal detection occurs precisely during decoupling. It is therefore decisive what happens during the decoupling time periods and the system must be designed for this high power.

As an example, we assume precise values for the power:

$$P_{peak} = 10W \quad \text{eq. 14}$$

Due to the duty cycle D of $$D = 0.2 \quad \text{eq. 15}$$

One obtains an average power $$\{P\} = D * P_{peak} = 2W \quad \text{eq. 16}$$

Advantageously, one fact slightly facilitates matters: The coldhead has a high thermal capacity. Therefore it (i.e. its characteristic, performance) is loaded only with the average load and in the first approximation one can assume that the temperature $T_F$ of the helium leaving the cooling system does not vary greatly during and in between the individual pulses. $T_F$ can thereby be regarded as given by the average power {P} and regarded as quite constant over short time periods. The further effects of the pulse power can be examined on the basis of these findings.

We define the temperature of the RF coils with $T_c$. Utilization of equation 9 then provides the following relation:

$$T_C = T_F + P * (R_{He} + R_{HX}) \quad \text{eq. 17}$$

If the expression from eq. 1b is used for $T_F$, one obtains $$T_c = T_{CHintr} + \{P\} * R_{CH} + P * (R_{He} + R_{HX}) \quad \text{eq. 18}$$

If $\Delta T_c$ is the change in the temperature of the RF coils 11 and 12 during decoupling compared to the temperature without decoupling, in accordance with $$\Delta T_c = T_c - T_{Chintr}, \quad \text{eq. 19}$$

we obtain the following expression for $\Delta T_c$ $$\Delta T_c = \{P\} * R_{CH} + P * (R_{He} + R_{HX}) \quad \text{eq. 20}$$

which will be evaluated below. P thereby represents the instantaneous power and {P} the average power (averaged over the period 52 of the experiment or longer).

A. Average Heating of the Decoupling Coil

For an average heating {$\Delta T_c$} we must insert the averaged {P} for P in eq. 20.

In accordance with the specifications, this produces, for a 100% effective heat exchanger 13 in accordance with equations 10 and 13, $$R_{HX}=R_{He}(1/E-1)=0 \qquad \text{eq. 21}$$

which gives, in accordance with equations 11, 13, 16 and 20

$$\{\Delta T_c\}=2W*0.6K/W+2W*0.6K/W=2.4K \qquad \text{eq. 22}$$

If the efficiency of the heat exchanger 13 is below 100%, the value is higher. For E=50%, we obtain an additional contribution of $R_{HX}$ in eq. 20 since the term $R_{HX}$ is no longer zero but given by eq. 10, thereby producing $$\{\Delta T_c\}=2W*0.6K/W+2W*(0.6K/W+0.6K/W)=3.6K \qquad \text{eq. 23}$$

We can see that in this example of a conventional arrangement, we obtain an average heating of 3.6K of the decoupling and detection coils with a 50% efficient heat exchanger in the cryohead and of 2.4K with perfect heat exchangers.

B. Heating of the Decoupling Coil During the Pulse:

We want to determine the peak temperature $T_{cpeak}$ which may occur during the decoupling pulse. This is given in accordance with eq. 20 by the change $\Delta T_{cpeak}$ of the temperature during decoupling compared to the temperature without decoupling:

$$\Delta T_{cpeak}=\{P\}*R_{CH}+P_{peak}*(R_{He}+R_{HX}) \qquad \text{eq. 24}$$

For {P} we use the value of eq. 16 and for the power P the peak power $P_{peak}$ in accordance with eq. 14. This produces, for a heat exchanger 13 with an efficiency of 100% (analogous to eq. 22), $$\Delta T_{peak}=2W*0.6K/W+10W*0.6K/W=7.2K \qquad \text{eq. 25}$$

and for a heat exchanger 13 with an efficiency of 50% (analogous to eq. 23).

$$\Delta T_c=2W*0.6K/W+10W*(0.6K/W+0.6K/W)=13.2K \qquad \text{eq. 26}$$

Figure 9:
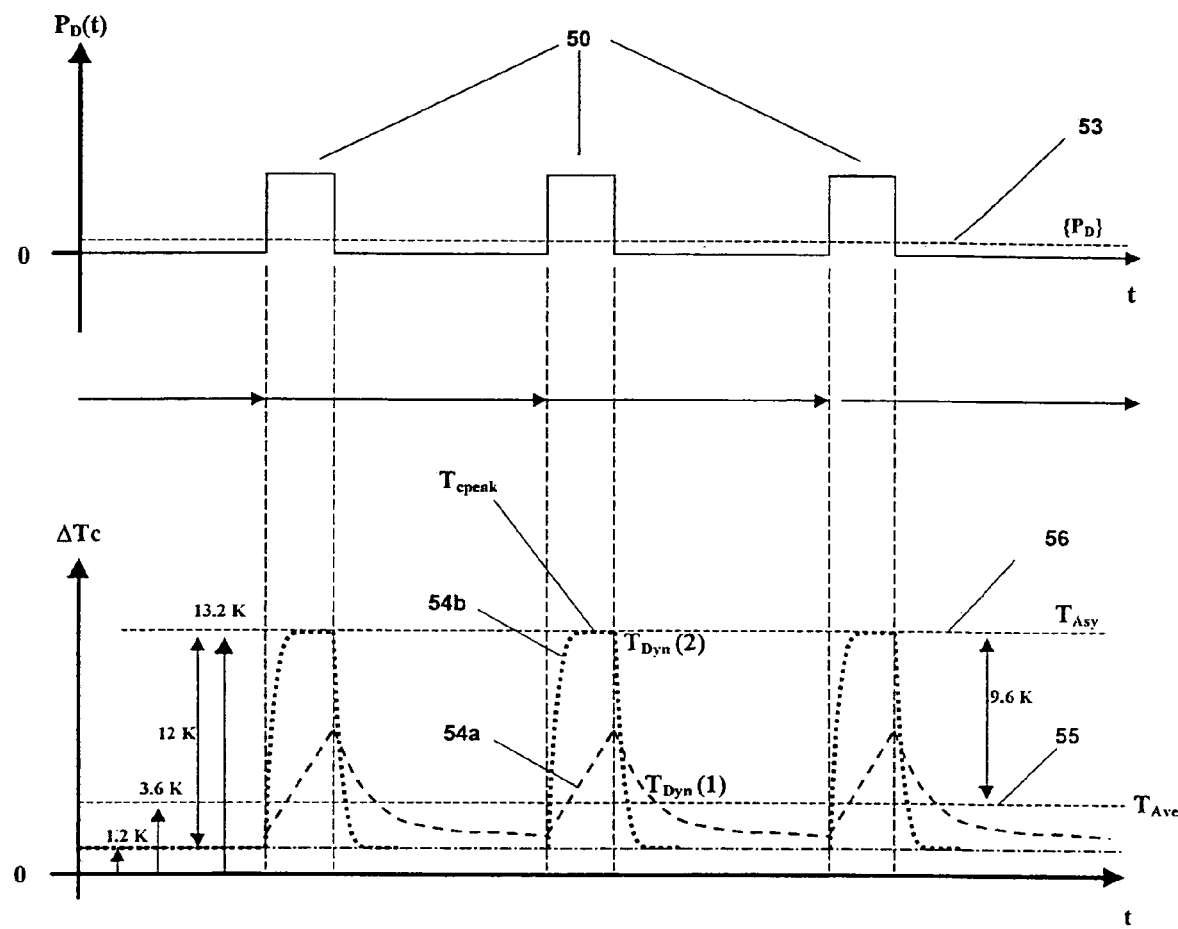
FIG. 9 shows a power-time diagram and temperature difference-time diagram for pulsed decoupling. The temperatures of the detection and decoupling coil are shown separately, as a qualitative illustration of a specific example of a conventional heat exchanger.

The corresponding time relations are quantitatively shown in FIG. 9 (only for the case of a 50% efficient heat exchanger. For other efficiencies, the corresponding numbers can be derived from table 1 or can be calculated using the given formulas.)

Heating of the Detection Coil

If the 1H and X coils are operated with the same heat exchanger, the detection coil is also heated by an average amount (with a 50% heat exchanger) of 3.6 K and additionally heated by a further 9.6 K (which unfortunately occurs exactly during acquisition, gradually or in steps). This has the disadvantages mentioned in section 2.4.

a) the noise temperature increases by up to 13.2 K compared to the non-decoupled case, which considerably deteriorates the S/N since the noise performance of the RF coil is proportional to its physical temperature.

b) the coil may be detuned producing spectra with phase errors. Moreover, table 1 also shows that with an efficiency of 100%, the temperature excursion and the maximum temperature of the detection coil are already very high. If the efficiency drops to or below 50%, these values becomes prohibitively large.

2. Analysis of the Inventive Arrangement (in Accordance with the Second Embodiment Variant)

Figure 12:
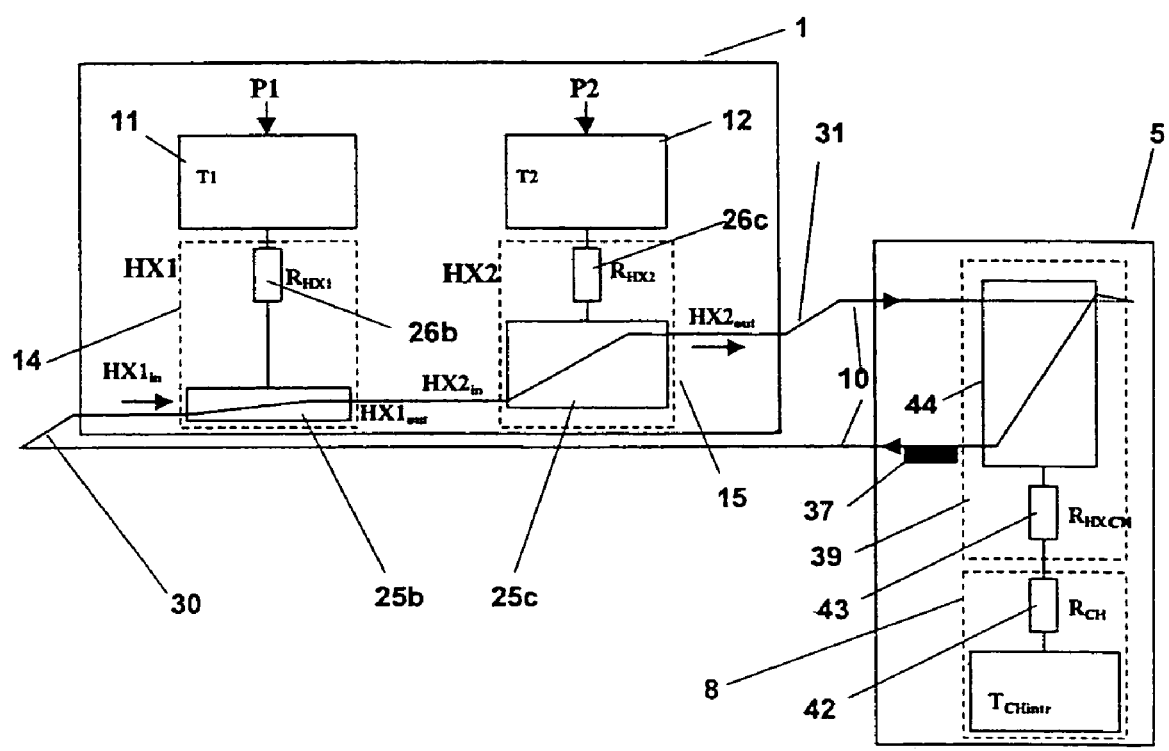
FIG. 12 shows an equivalent thermal circuit diagram of the second inventive arrangement.

FIG. 12 shows the equivalent circuit diagram of an inventive arrangement in accordance with FIG. 1

Two heat exchangers must be considered; HX1 (14) for the detection coil and HX2 (15) for the decoupling coil. It is important for the following considerations and for an optimum function that flow occurs in the stated order. The detection coil 11 dissipates the power P1, the decoupling coil 12 dissipates the power P2.

The following is obtained for the temperatures T1 of the detection coil and T2 of the decoupling coil:

$$T1=T_F+P1*(R_{He}+R_{HX1}) \qquad \text{eq. 27}$$

$$T2=T_F+P1*R_{HE}+P2*(R_{He}+R_{HX2}) \qquad \text{eq. 28}$$

wherein $T_F$ is given in accordance with eq. 1b by:

$$T_F=T_{CHintr}+\{P\}*R_{CH} \qquad \text{eq. 1b}$$

TABLE 1 temperature increase during pulses with heat exchanger HX with varying efficiency (with the conditions stated in the text).

| Efficiency of the heat exchanger HX | Heating of the cooler | Temperature increase (in addition to cooler heating) during the pulse of HX | Average temperature increase on HX (total) corresponds to the average temperature increase of the detection coil | Minimum temperature increase on HX | Temperature excursion (Tmax − Tmin) of the decoupling coil | Max. temperature increase decoupling coil (total) | Max. t. excursion of the detection coil | Max. temperature increase of the detection coil |
|---|---|---|---|---|---|---|---|---|
| 100% | 1.2K | 6K | 2.4K | 1.2K | 6K | 7.2K | 6K | 7.2K |
| 50% | 1.2K | 12K | 3.6K | 1.2K | 12K | 13.2K | 12K | 13.2K |
| 20% | 1.2K | 30K | 7.2K | 1.2K | 30K | 31.2K | 30K | 31.2K | and the average power is given by $$\{P\}=\{P1+P2\} \quad \text{eq. 29}$$

The evaluation of the temperature increase of the detection coil $\Delta T1$ results, as mentioned above, in $$\Delta T1 = P1*(R_{He}+R_{HX})+\{P\}*R_{CH} \quad \text{eq. 30}$$

We now consider the influence of the decoupling coil and therefore neglect P1. P1=0 and in eq. 29 $\{P\}=\{P1\}$ which then gives eq. 31 from eq. 30:

$$\Delta T1 = \{P2\}*R_{CH} \quad \text{eq. 31}$$

One can see that equation 31 merely contains the average value $\{P2\}$ of the decoupling power P2, the momentary value (and hence also any high pulse power values) no longer contributes. The temperature is no longer increased by the He enthalpy (the system behaves as if the He flow were infinitely large). The thermal resistance $R_{HX2}$ and therefore also the efficiency of the heat exchanger (HX2) no longer contribute.

The heating of the detection coil now only depends on the average power $\{P\}=\{P2\}$ at the cooler and the characteristic performance of the cooler.

Evaluation of equation 31 analogously to table 1 is shown in table 2.

3. The short-term temperature fluctuations of the detection coil are practically zero. This greatly differs from prior art where very large fluctuations (e.g. of 12K with 50% efficiency) can occur.

4. The average heating of the detection coil compared to the unloaded state is at an absolute minimum (1.2K compared to 3.6K with 50% efficient heat exchanger). The average increase (1.2K) can be avoided using regulation (flow heater 37 in FIG. 12 or heater 17 in the probe head of FIG. 1 together with a temperature measurement at the temperature sensor 16) if the regulation point is correspondingly increased right from the outset (at least 1.2K above the unloaded state). This value of 1.2K is an absolute minimum and determined by the cooler and cannot be reduced further.

It must be explicitly emphasized that the inventive augmentation to two heat exchangers permits unexpected and very substantial improvement in performances surpassing some of the limits given by the final efficiency of heat exchangers and heat transfer by the gaseous He and replaces same by a solution which is nearly ideal.

3. Embodiment Variant: Parallel Cooling

A somewhat modified variant of the second embodiment variant consists in that the heat exchanger 15 of the decoupling coil is not disposed in series with the heat exchanger

TABLE 2

Temperature increase during pulses with heat exchanger HX2 with varying efficiency of the decoupling coil (with the conditions stated in the text).

| Efficiency of HX2 | Heating of the cooler | Temperature increase (in addition to cooler heating) during the pulse on HX2 | Average temperature increase on HX2 (total) | Minimum temperature increase on HX2 | Temperature excursion (Tmax − Tmin) of the decoupling coil | Max. temperature increase decoupling coil (total) | Max. t. excursion of the detection coil | Max. temperature increase of the detection coil |
|---|---|---|---|---|---|---|---|---|
| 100% | 1.2K | 6K | 2.4K | 1.2K | 6K | 7.2K | 0K | 1.2K |
| 50% | 1.2K | 12K | 3.6K | 1.2K | 12K | 13.2K | 0K | 1.2K |
| 20% | 1.2K | 30K | 7.2K | 1.2K | 30K | 31.2K | 0K | 1.2K |

Figure 13:
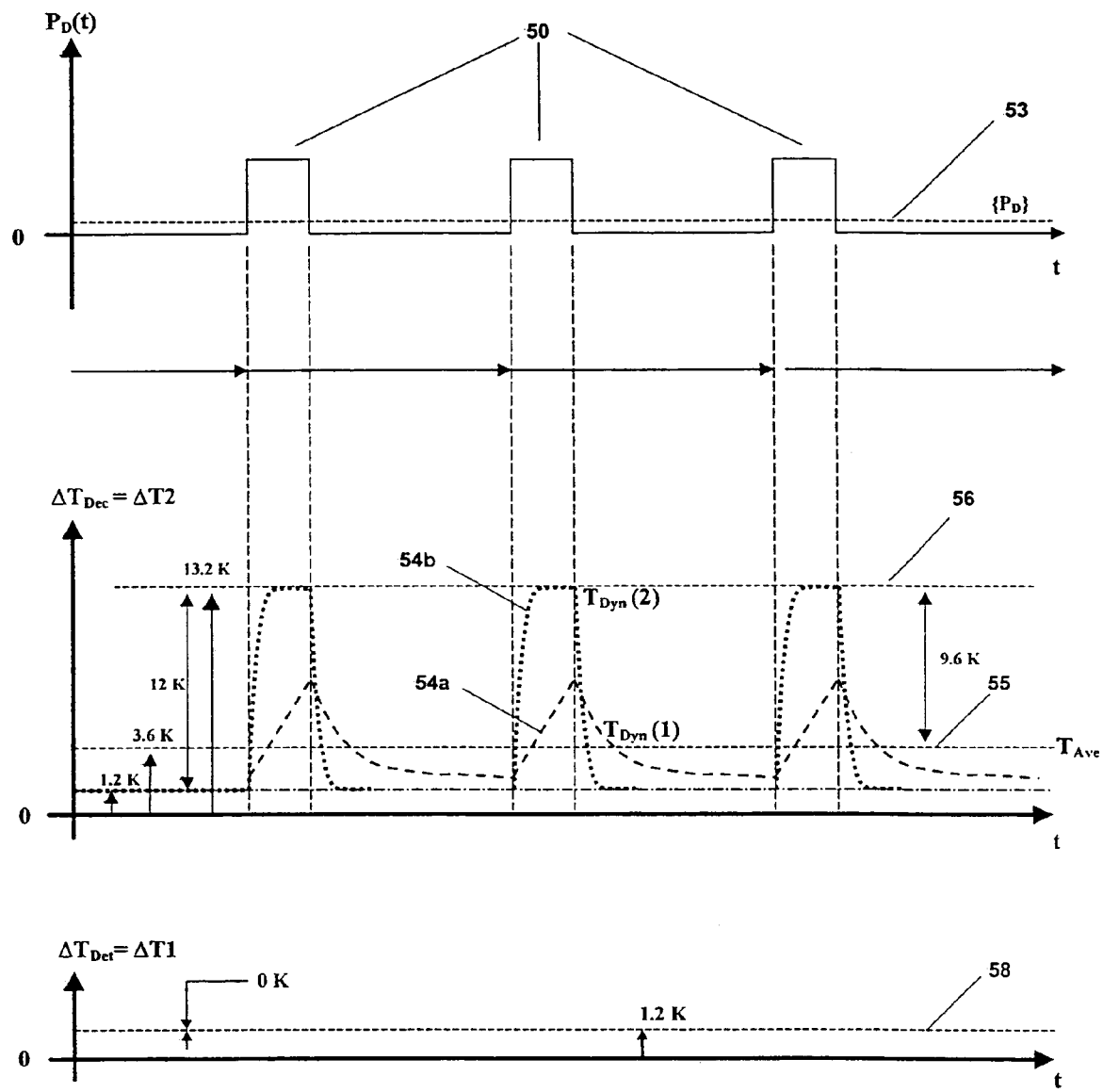
FIG. 13 shows a power-time diagram and temperature difference-time diagram for pulsed coupling. The temperatures of the detection and decoupling coils are shown separately in quantitative illustration of the specific example with two heat exchangers of an inventive arrangement.

Discussion:

FIG. 13 shows the temperatures of the detection and decoupling coils as a function of time. In contrast to FIG. 9, which shows only one temperature $T_c$, the common temperature of both coils, FIG. 13 separately shows the two temperatures T1 and T2, of the detection and decoupling coils. $\Delta T1$ is herein also referred to as $\Delta T_{Det}$ and $\Delta T2$ is also, referred to as $\Delta T_{Dec}$ to define the detection coil temperature and the decoupling coil temperature.

The fluctuations in the temperature T1 are now ZERO to a very good approximation and independent of the efficiency of the WT2. This is due to the inventive arrangement, wherein the thermal flow of the decoupling coil does not reach WT1. It should be noted herein that generated fluctuations in $T_F$ in this arrangement are very small and slow and can generally be easily controlled to negligible small residual variations using the described optional regulation having a temperature sensor 16 and heater 17.

The advantages of this embodiment variant compared to prior art can be summarized:

1. The efficiency of the heat exchanger in the head no longer plays a role.

2. The magnitude of the He mass flow no longer plays a role.

Figure 14:
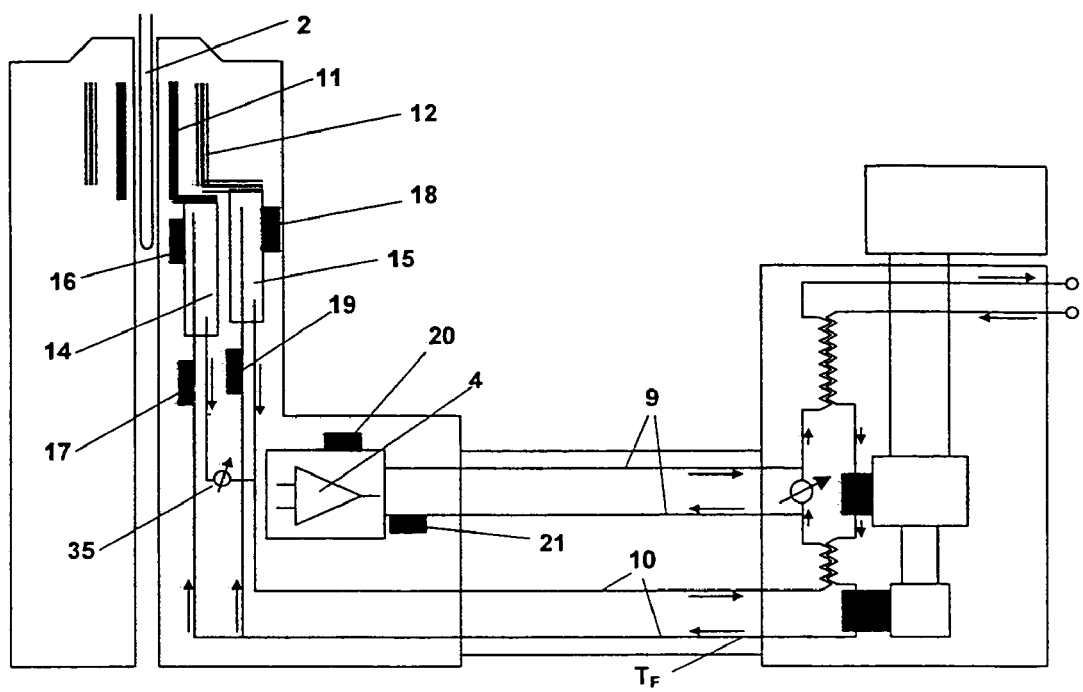
FIG. 14 shows a third variant of an inventive arrangement, wherein the heat exchangers are connected in parallel with temperature measurement and heating elements for temperature control of all heat exchangers.

14 of the detection coil, rather parallel thereto. An arrangement of this type is shown in FIG. 14 in fully augmented construction with temperature measurement and regulation of all stages (which is not absolutely necessary). It has the same substantial inventive properties as the embodiment variant 2. An exact analysis of this arrangement is omitted herein. This possible arrangement has the following differing properties compared to the second embodiment variant:

a) the same equation applies for the overall thermal balance as in the second embodiment variant. In particular, $T_F$ is still given through equation 1b. In case of identical load of P1 and P2, $T_F$ will always remain the same as in the embodiment variant 2.

b) the flow through the two heat exchangers is no longer the same as the flow out of the cooler in loop 10. Controlled branching of the He flow is required which may necessitate a throttle valve 35 which may be provided downstream of the heat exchanger 14 as shown. Other locations may be possible and reasonable, such as e.g. downstream of the heat exchanger 15 or upstream of one of the heat exchangers.

c) the heat exchanger HX1, 14 of the detection coil still receives gas at a temperature $T_F$ (in accordance with point a) above) but it is no longer subjected to the full He flow.

Therefore $(R_{HX1}+R_{He})$ will be higher in variant 2, since $R_{He}$ is increased with decreasing mass flow due to equation 7.

d) the heat exchanger HX2, 15 no longer receives the full He flow whereby $(R_{HX1}+R_{He})$ also increases slightly e) the overall efficiency will thereby always be less than in variant 2. Additionally, the distribution of the currents depends on the expected power which is complicated. The advantage of this arrangement is that in case of possible reverse operation (decoupling on the first RF coil 11 and hence on the first heat exchanger HX1, 14 and detection on the coil 12), both temperatures T1 and T2 still remain independent (no effect on the heat exchanger 15 and the temperature of the second coil 12 which now serves as receiving coil).

f) in variant 2, a reverse operation in accordance with point e) would still have a better performance compared to prior art since the inefficiency of HX1 (14) has no effect on the heating of the gas flow and the receiving coil 18 is less heated compared to cooling with coil 11 by one single common heat exchanger 13. An increase of the performance beyond that to the level of the embodiment variant 2 would require reversal of the flow direction with all associated constructive consequences. This is technically possible but demanding.

4. Embodiment Variant: Generalization to n Heat Exchangers

Figure 15:
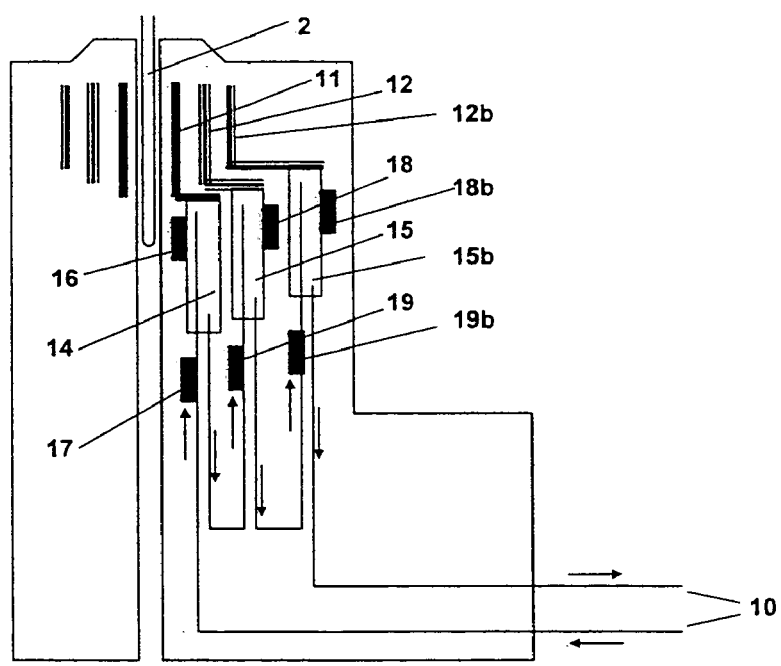
FIG. 15 shows a detail of the heat exchanger arrangement for the fourth embodiment variant, wherein the heat exchangers are connected in series.

The embodiment variants 1–3 can be generalized to any number of n heat exchangers. In particular, e.g. 3 heat exchangers may be used. The third heat exchanger can be used e.g. for a second decoupling channel. Series arrangement with the heat exchangers 14 for the detection coil and the heat exchangers 15 and 15b for the decoupling coils 12 and 12b is shown in FIG. 15 in full configuration with temperature measurement and control of all stages (which is not necessary). This arrangement is advantageous in that, in addition to coil 11, detection with coil 12 is also possible without direct heating thereof through simultaneous decoupling with the coil 12b.

Figure 16:
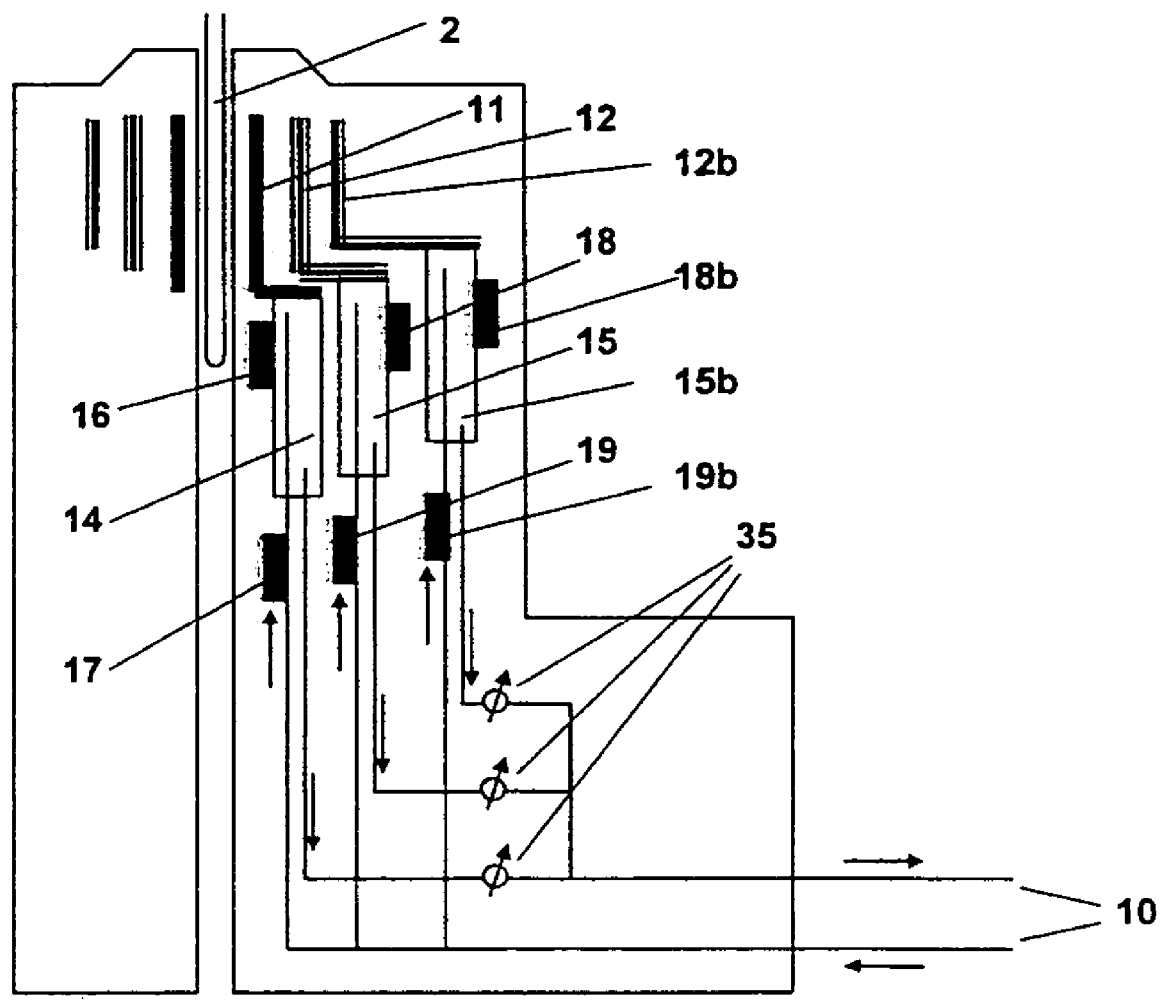
FIG. 16 shows a detail of the heat exchanger arrangement for the fourth embodiment variant, wherein the heat exchangers are connected in parallel.

FIG. 16 shows a parallel arrangement of three heat exchangers 14 and 15 and 15b also in full configuration with temperature measurement and regulation of all stages (which is not necessary). Each of the cooling flows may be individually adjusted if required via a throttle valve 35. In such an arrangement, none of the RF coils 11, 12, or 12b is directly heated through decoupling by another coil. Heating is also effected herein only by the average value {P} which results from the sum of all average powers and the characteristic performance of the cooler. The currently thermally unloaded coils are heated slowly by a minimum amount in accordance with equation 1b.

Any combination of series and parallel connections is possible whose arrangement can be determined in dependence on the expected types of application.

The favorable properties obtained in the four embodiments have been described and analyzed using a fluid consisting of gaseous helium. Another gas for thermal transport is also possible such as the use of a fluid with two phases. The fluid which enters the cryohead may be fluid or a mixture of fluid and gaseous phases (in particular liquid/gaseous helium). The observations mentioned herein can be carried out with the additional energy balance given by the heat of vaporization. Such considerations produce direct advantages compared to prior art with two-phase fluids in all cases where the fluid exiting the cryohead has no liquid phase, since in a conventional arrangement, the heat exchanger 13 must utilize the specific heat of the gaseous phase which is fundamentally associated with a temperature increase and increases the minimum temperature of the detection coil. In an inventive arrangement, this temperature increase of the detection coil can be avoided. Also in cases where the exiting fluid always comprises a fluid phase portion, reduction of the receiving coil temperature and fluctuations thereof are possible since the inventive arrangements avoid the internal thermal resistances (inefficiency) of the heat exchanger 13 which are always present in prior art and therefore undesired additional temperature increases and fluctuations of the detection coil as a consequence of the average and pulsed thermal load.

Although the above analysis was carried out with a closed cooling cycle, the present invention is also reasonable and advantageous for use of an open cooling arrangement (e.g. LHe from the barrel). The term "cooling loop" may refer to an open cooling cycle as well as to an open one-way arrangement.

It must further be noted that in the above-mentioned description, the transmitting/decoupling coil excited a different nucleus than the detection coil. The inventive separation is, however, also possible and reasonable for a nucleus common to both channels. One channel leads to the detection coil while the other channel is guided to the transmitting coil for the same separated nucleus. The transmitting and receiving functions can thereby be separated into two RF coils/resonators not only between two different nuclei but also using the same nucleus, one channel with RF coil for detection, the other for transmitting/decoupling. Such an arrangement is advantageous in that some or all transmitting coils can basically be set e.g. to the further (second) heat exchanger and all detection coils can be set to the first heat exchanger. Such an arrangement dissipates heat only on the second heat exchanger whereas the first remains free from dissipation and therefore at an optimum cold and stable temperature, independently of the respective operating mode. In this sense, the term "channel" refers to one RF coil or resonator each, completely irrespectively thereof for which nucleus same is provided or at which frequency it is operated.

In summary, one can say that separation of the heat exchanger in the cryohead for cooling the RF coils into two or more different heat exchangers can considerably improve the properties of a cryohead. This applies to minimization of the absolute temperature of the receiving coil during operation, and to the temperature fluctuations which are practically completely eliminated in the pulsed operation typical for these applications. The constructive design of the multiple heat exchangers in the usually greatly limited space of a cryohead is a constructive challenge which can be solved with the known technologies and methods. The effort required for an inventive cryohead is acceptable, since one obtains an extremely efficient and stable system.

List of Reference Numerals

| | |
|---|---|
| 1 | Cryohead |
| 2 | Sample |
| 3 | Vacuum |
| 4 | Cold pre-amplifier |
| 5 | Cooling system |
| 6 | Coldhead |
| 7 | First stage coldhead |
| 8 | Second stage coldhead |
| 9 | "warm" cooling loop |
| 10 | "cold" cooling loop |

| | |
|---|---|
| 11 | detection coil |
| 12 | decoupling coil |
| 12b | further decoupling coil |
| 13 | heat exchanger for the RF coils (commonly for detection and decoupling coil) |
| 14 | Heat exchanger for detection coil |
| 15 | Heat exchanger for decoupling coil |
| 16 | Temperature sensor detection coil |
| 17 | Heater detection coil |
| 18 | Temperature sensor decoupling coil |
| 18b | Temperature sensor of further decoupling coils |
| 19 | Heater decoupling coil |
| 19b | Heater of further decoupling coils |
| 20 | Temperature sensor pre-amplifier |
| 21 | Heater pre-amplifier |
| 22 | Central tube |
| 23 | Bypass cooling electronics |
| 24 | Heat exchanger in general |
| 25 | Ideal heat exchanger in general |
| 25b | Ideal heat exchanger as part of the heat exchanger 14 |
| 25c | Ideal heat exchanger as part of the heat exchanger 15 |
| 26 | Internal resistance of the heat exchanger in general |
| 26b | Internal resistance of the heat exchanger as part of the heat exchanger 14 |
| 26b | Internal resistance of the heat exchanger as part of the heat exchanger 15 |
| 27 | Object to be cooled in general |
| 28 | Cooling medium entry into the heat exchanger |
| 29 | Cooling medium exit from the heat exchanger |
| 30 | Heat loss (temperature increase in the forward flow) |
| 31 | Heat loss (temperature increase in the return flow) |
| 32 | Counterflow heat exchanger in the cooler (between room temperature and first stage) |
| 33 | Counterflow heat exchanger in the cooler (between first and second stage) |
| 34 | Bypass of the pre-amplifier cooling |
| 35 | Throttle valve to control the cooling agent flow with parallel arrangement of the heat exchangers |
| 36 | Temperature sensor for the RF coils |
| 37 | Heater for the RF coils |
| 38 | Stage heat exchanger of the first coldhead stage |
| 39 | Stage heat exchanger of the second coldhead stage |
| 40 | Transfer line |
| 41 | Connections for circulation pump (compressor) at room temperature |
| 42 | Cooler characteristic performance, described by equivalent heat resistance |
| 43 | Inner resistance of the cooler heat exchanger |
| 44 | Ideal heat exchanger on the cooler (2nd stage) |
| 45–49 | Not used |
| 50 | Decoupling pulse |
| 51 | Break between decouplings |
| 52 | Repetition period of the experiment |
| 53 | Average decoupling performance |
| 54a | Time dependence on the heat exchanger with long thermal time constant |
| 54b | Time dependence on the heat exchanger with short thermal time constant |
| 55 | Average temperature at the heat exchanger |
| 56 | Asymptotic maximum temperature at the heat exchanger |
| 57 | Minimum temperature at the heat exchanger |
| 58 | Temperature of the detection coil |

List of the abbreviations used

| | |
|---|---|
| $P_D(t)$ | time-dependent decoupling power |
| $\{P_D\}$ | average decoupling power (time average) |
| $T_{Ave}$ | average temperature of the . . . coils (depending on the context) |
| $T_{Asy}$ | asymptotic temperature which can be reached during decoupling |
| C | specific heat of the coil components (heat exchanger 13 and coils 11 and 12) |
| $T_{Dyn}(1)$ | dynamic temperature dependence with high C |
| $T_{Dyn}(2)$ | dynamic temperature dependence with low C |
| T1 | temperature of the detection heat exchanger |
| T2 | temperature of the decoupling heat exchanger |
| $T_F$ | output temperature of the cold cooling loop 10 (forward) of the cooling system |
| $T_{CHintr}$ | intrinsic (minimum) temperature of the second stage of the coldhead without thermal load from the dissipated RF power |
| HX | heat exchanger in the cryohead for cooling both RF coils |
| $HX_{in}$ | He entering the heat exchanger |
| $HX_{out}$ | He exiting the heat exchanger |
| P | thermal load of the object to be cooled |
| $T_{load}$ | temperature of the thermal load (of the object to be cooled) |
| $dT_{flow}$ | heating of the gas flow |
| $dT_{load}$ | heating of the thermal load compared to the temperature of the incoming gas flow |
| dm/dt | mass flow of the gas per unit time |
| Cp | specific heat of the gas |
| $R_{HX}$ | internal thermal resistance of a heat exchanger to describe its inefficiency |
| $T_c$ | temperature of the RF coils (both detection and decoupling coils together) |
| $P_{peak}$ | peak performance during decoupling |
| $T_{cpeak}$ | peak temperature of the coils |
| HX1 | heat exchanger (14) of the detection coil (11) |
| HX2 | heat exchanger (15) of the decoupling coil (12) |
| P1 | heat input of the detection coil |
| P2 | heat input of the decoupling coil |
| $\Delta T1 = \Delta T_{Det}$ | temperature increase of the detection coil |
| $\Delta t2 = \Delta T_{Dec}$ | temperature increase of the decoupling coil |
| $R_{HX1}$ | internal thermal resistance of the heat exchanger HX1 |
| $R_{HX2}$ | internal thermal resistance of the heat exchanger HX2 |

I claim:

1. A cryohead for nuclear magnetic resonance measurements (NMR), the cryohead comprising:

a housing;

a first RF coil disposed in said housing, said first RF coil for detection of NMR signals in a detection channel;

a second RF coil disposed in said housing, said second RF coil for transmitting or decoupling in a transmitting or decoupling channel;

a first heat exchanger disposed in said housing and communicating with said first RF coil to cool said first RF coil to cryogenic temperatures, said first heat exchanger structured for acceptance of a first cooling, flow-through fluid; and a second heat exchanger disposed in said housing and communicating with said second RF coil to cool said second RF coil to cryogenic temperatures, said second heat exchanger structured for acceptance of said first or a second cooling flow-through fluid, wherein said second heat exchanger is separated from said first heat exchanger.

2. The cryohead of claim 1, wherein said cooling fluid is helium.

3. The cryohead of claim 1, wherein said first heat exchanger can be cooled by a fluid cooling loop which is separated from a cooling loop of said second heat exchanger.

4. The cryohead of claim 1, wherein said first exchanger and said second heat exchanger are structured for cooling via a common fluid coaling loop.

5. The cryohead of claim 4, further comprising at least one third RF coil disposed in said housing and at least one third heat exchanger disposed in said housing and communicating with said at least one third RF coil to cool said at least one third RF coil to cryogenic temperatures, said at least one third heat exchanger structured for acceptance of said first, said second, or at least one third cooling flow-through fluid, wherein said at least one third heat exchanger is separated from said first and said second heat exchangers.

6. The cryohead of claim 5, wherein said first, said second, and said at least one third heat exchanger are structured for cooling via at least three parallel paths of said common fluid cooling loop.

7. The cryohead of claim 5, wherein said first, said second, and at said least one third heat exchanger are structured for cooling via at least three paths of said common fluid cooling loop which extend in series.

8. The cryohead of claim 7, wherein cooling fluid first passes through said first heat exchanger and then through said second heat exchanger and subsequently through said at least one third heat exchanger.

9. The cryohead of claim 5, wherein said common fluid cooling loop passes through said first heat exchanger, said heat exchanger, and said at least one third heat exchanger in a combination of paths, extending in both parallel and in series.

10. The cryohead of claim 4, wherein said first exchanger and said second exchanger are structured for cooling via two parallel branched paths of said common fluid cooling loop.

11. The cryohead of claim 4, wherein said first heat exchanger and said second heat exchanger are structured for cooling with paths of said common cooling loop which are disposed in series.

12. The cryohead of claim 11, wherein a cooling fluid first passes through said first heat exchanger and subsequently passes through said second heat exchanger.

13. The cryohead of claim 1, wherein exactly one said first heat exchanger cools the RF coils or resonators of all detection channels.

14. The cryohead of claim 13, wherein several detection channels are provided.

15. The cryohead of claim 1, wherein exactly one second heat exchanger cools RF coils or resonators of all transmitting or decoupling channels.

16. The cryohead of claim 15, wherein several transmitting or decoupling channels are provided.

* * * * *